United States Patent
Wang

(10) Patent No.: US 12,308,803 B2
(45) Date of Patent: May 20, 2025

(54) SWITCHING POWER SUPPLY FREQUENCY ADAPTIVE ADJUSTMENT METHOD, SYSTEM AND ELECTRONIC DEVICE

(71) Applicant: SHENZHEN JIANGNAN INDUSTRIAL CO., LTD., Guangdong (CN)

(72) Inventor: Wanqing Wang, Guangdong (CN)

(73) Assignee: SHENZHEN JIANGNAN INDUSTRIAL CO., LTD., Guangdong (CN)

( * ) Notice: Subject to any disclaimer, the term of this patent is extended or adjusted under 35 U.S.C. 154(b) by 406 days.

(21) Appl. No.: 18/076,471

(22) Filed: Dec. 7, 2022

(65) Prior Publication Data
US 2024/0072657 A1 Feb. 29, 2024

Related U.S. Application Data

(63) Continuation of application No. PCT/CN2022/115537, filed on Aug. 29, 2022.

(30) Foreign Application Priority Data

Aug. 24, 2022 (CN) .......................... 202211023990.1

(51) Int. Cl.
*H03F 3/18* (2006.01)
*H03F 3/183* (2006.01)
(Continued)

(52) U.S. Cl.
CPC ............. *H03F 3/183* (2013.01); *H04B 17/29* (2015.01); *H02M 3/33507* (2013.01); *H03F 2200/03* (2013.01)

(58) Field of Classification Search
CPC ..... H03F 3/183; H03F 2200/03; H04B 17/29; H02M 3/33507
See application file for complete search history.

(56) References Cited

U.S. PATENT DOCUMENTS

2007/0191073 A1* 8/2007 May .................... H04B 15/005
455/572
2009/0276639 A1* 11/2009 Saha .................... H02M 3/156
713/300
(Continued)

FOREIGN PATENT DOCUMENTS

CN 1476186 A 2/2004
CN 203313165 U 11/2013
(Continued)

OTHER PUBLICATIONS

Xiao, Li, et al.; Study on the Interference of Switching Power Supply to the AM Signal of Car Radio; 1674-1986; Jul. 13, 2016; 4 Pages.

(Continued)

*Primary Examiner* — Junpeng Chen
(74) *Attorney, Agent, or Firm* — Cooper Legal Group, LLC

(57) ABSTRACT

Disclosed are a method, system and electronic device method for adaptively adjusting frequency of a switching power supply. The method includes: obtaining a SNR threshold, obtaining a SNR value of an AM/FM radio demodulator; when the SNR value is smaller than a SNR threshold, outputting a plurality of control signals to the (Continued)

switching power supply, obtaining a plurality of corresponding operation frequencies of the switching power supply; obtaining a plurality of SNR values of the AM/FM radio demodulator at each of the plurality of operation frequencies, obtaining a maximum SNR value among the plurality of SNR values; outputting a control signal corresponding to the maximum SNR value, controlling the operation frequency of the switching power supply with the control signal; obtaining the SNR value of the AM/FM radio demodulator at a preset time period, and comparing the SNR value to the SNR threshold.

10 Claims, 9 Drawing Sheets

(51) Int. Cl.
*H04B 17/29* (2015.01)
*H02M 3/335* (2006.01)

(56) References Cited

U.S. PATENT DOCUMENTS

| | | | | |
|---|---|---|---|---|
| 2013/0208775 | A1* | 8/2013 | Wang | H04B 3/54 |
| | | | | 375/224 |
| 2014/0082455 | A1* | 3/2014 | Yosoku | H03M 13/6527 |
| | | | | 714/763 |
| 2021/0287880 | A1* | 9/2021 | Van Zyl | H01J 37/32183 |
| 2023/0361806 | A1* | 11/2023 | Shen | H02M 1/44 |

FOREIGN PATENT DOCUMENTS

| | | |
|---|---|---|
| CN | 108123726 A | 6/2018 |
| CN | 210670041 U | 6/2020 |
| CN | 211046744 U | 7/2020 |
| JP | 2007189871 A | 7/2007 |

OTHER PUBLICATIONS

International Search Report Corresponding to Application PCT/CN2022/115537; 4 Pages.

* cited by examiner

```
┌─────────────────────────────────────────────────────┐
│ obtaining a SNR threshold, obtaining a SNR value of an AM/FM │
│ radio reception demodulatorradio demodulator in real time,   │──S1
│ and comparing the SNR value towith the SNR threshold         │
└─────────────────────────────────────────────────────┘
                          │
┌─────────────────────────────────────────────────────┐
│ when the SNR value of the AM/FM radio demodulator is smaller │
│   than the SNR threshold, outputting a plurality of control  │
│    signals to the switching power supply, and obtaining a    │──S2
│   plurality of operation frequencies of the switching power  │
│  supply at which the switching power supply is controlled by │
│          each of the plurality of control signals            │
└─────────────────────────────────────────────────────┘
                          │
┌─────────────────────────────────────────────────────┐
│     obtaining a plurality of SNR value of the AM/FM radio    │
│      demodulator at each of the plurality of operation       │──S3
│   frequencies, and obtaining a maximum SNR value among the   │
│                     plurality of SNR values                  │
└─────────────────────────────────────────────────────┘
                          │
┌─────────────────────────────────────────────────────┐
│   outputting a control signal corresponding to the maximum   │
│    SNR value, and controlling the operation frequency of the │──S4
│          switching power supply with the control signal      │
└─────────────────────────────────────────────────────┘
                          │
┌─────────────────────────────────────────────────────┐
│ periodically obtaining a SNR value of the AM/FM radio        │
│ demodulator at a preset time period, and comparing the SNR   │──S5
│ value to the SNR threshold                                   │
└─────────────────────────────────────────────────────┘
```

FIG. 1

```
┌─────────────────────────────────────────────────────────────┐
│ trigger condition for initiating a automatic adjustment     │
│ mode of the switching power supply frequency                │
│  ┌───────────────────────────────────────────────────┐      │
│  │ obtaining a start signal of an AM/FM audio source input │──── S01
│  │ mode, and determining whether to obtain a SNR value of the │
│  │ AM/FM radio demodulator and compare the SNR value to the SNR │
│  │ threshold base on the start signal of the AM/FM audio source │
│  │                    input mode                     │      │
│  └───────────────────────────────────────────────────┘      │
│  ┌───────────────────────────────────────────────────┐      │
│  │    obtaining a manual FM signal of an AM/FM mode, and   │──── S02
│  │ determining whether to obtain a SNR value of the AM/FM radio │
│  │ demodulator and compare the SNR value to the SNR threshold │
│  │        base on the manual FM signal of AM/FM mode │      │
│  └───────────────────────────────────────────────────┘      │
│  ┌───────────────────────────────────────────────────┐      │
│  │  obtaining a periodic adjustment signal, and when a the │──── S03
│  │  preset period for the periodic adjustment signal is reached, │
│  │  obtaining the SNR value of the AM/FM radio demodulator, │
│  │     comparing the SNR value with the SNR threshold │    │
│  └───────────────────────────────────────────────────┘      │
└─────────────────────────────────────────────────────────────┘
```

FIG. 2

```
┌─────────────────────────────────────────────────────┐──── S301
│ separately obtaining a plurality of PWM control signals │
│ at different duty cycles                            │
└─────────────────────────────────────────────────────┘
                          ↓
┌─────────────────────────────────────────────────────┐──── S302
│ separately converting the plurality of PWM control  │
│ signals into a plurality of voltage signals         │
└─────────────────────────────────────────────────────┘
                          ↓
┌─────────────────────────────────────────────────────┐──── S303
│ separately converting the plurality of voltage signals │
│ into a plurality of current signals                 │
└─────────────────────────────────────────────────────┘
                          ↓
┌─────────────────────────────────────────────────────┐──── S304
│   converting the plurality of current signals into a │
│  plurality of operation frequencies at different duty │
│                       cycles                        │
└─────────────────────────────────────────────────────┘
```

FIG. 3

SWITCHING POWER SUPPLY FREQUENCY ADAPTIVE ADJUSTMENT METHOD, SYSTEM AND ELECTRONIC DEVICE

CROSS-REFERENCE TO RELATED APPLICATION

The present application is a continuation of PCT application No. PCT/CN2022/115537, filed on Aug. 29, 2022, which claims the priority benefit of China patent application No. 202211023990.1, filed on Aug. 24, 2022. The entireties of PCT application No. PCT/CN2022/115537 and China patent application No. 202211023990.1 are incorporated herein by reference and made a part of this specification.

TECHNICAL FIELD

The present application relates to the field of switching power supply, and in particular to a switching power supply frequency adaptive adjustment method, system and electronic device.

BACKGROUND

AM/FM broadcast receiver is often used in a harsh environment such as a construction site. Such broadcast receiver is usually drove by a switching power supply, which generally has a power higher than a rated power of the traditional home broadcast receiver so as to broadcast in the construction site environment which is broader and noisier. When the SNR of the broadcast receiver is maximum, the broadcast receiver has the best reception effect and the interference of switching power supply to the radio receiver is minimum. The switching power supply will generate electromagnetic radiation, which will interfere with the operation of the tuning circuit of the broadcast receiver. Thus, decreasing of the SNR value will degrade the audio quality from the broadcast receiver. In addition, the degree of interference increases in direct proportion to the rated power of the switching power supply.

In the prior art, in order to improve the quality of radio frequency output by the broadcast receiver, a broadcast receiver device drove by a switching power supply adopts an electromagnetic shielding technology, in which the switching power supply module is packaged in a mental box so as to reduce the interference of electromagnetic wave radiation on the tuning circuit.

However, as to the above related art, the electromagnetic wave may be still transmitted to an AM/FM demodulator via a connecting cable of the switching power supply, which will interfere with the electronic devices including an AM/FM tuner, and which still decreases audio quality from the broadcast receiver.

SUMMARY

To decrease the interference of the switching power supply in the broadcast receiver, and improve audio quality from the broadcast receiver, the present application provides a method, system and electronic device for adaptively adjusting frequency of a switching power supply.

In a first aspect, a method for adaptively adjusting frequency of a switching power supply provided in the present application adopts the following technical solution.

A method for adaptively adjusting frequency of a switching power supply, including:
  obtaining a SNR threshold, obtaining a SNR value of an AM/FM radio demodulator in real time, and comparing the SNR value with the SNR threshold;
  when the SNR value of the AM/FM radio demodulator is smaller than the SNR threshold, outputting a plurality of control signals to the switching power supply, and obtaining a plurality of operation frequencies of the switching power supply at which the switching power supply is controlled by each of the plurality of control signals;
  obtaining a plurality of SNR values of the AM/FM radio demodulator at each of the plurality of operation frequencies, and obtaining a maximum SNR value among the plurality of SNR values;
  outputting a control signal corresponding to the maximum SNR value, and controlling the operation frequency of the switching power supply with the control signal; and
  periodically obtaining a SNR value of the AM/FM radio demodulator at a preset time period, and comparing the SNR value to the SNR threshold.

By adopting the above technical solution, when the SNR value of the AM/FM radio demodulator is smaller than the SNR threshold, a plurality of control signals control the switching power supply in sequence, the SNR values and the operation frequencies at which the switching power supply is controlled by each of the plurality of control signals are obtained and the switching power supply is controlled with the operation frequency of the maximum SNR value in a certain period of the cycle, so that the frequency of the switching power supply can be the optimum frequency in a certain period of the cycle. In addition, by periodically repeating the method, the switching power supply is adaptively adjusted to the optimum frequency of maximum SNR value, the interference of the switching power supply in the broadcast receiver is reduced, and audio quality from the broadcast receiver is degraded.

Optionally, obtaining a plurality of operation frequencies of the switching power supply at which the switching power supply is controlled by each of the plurality of control signals comprises:
  separately obtaining a plurality of PWM control signals at different duty cycles;
  separately converting the plurality of PWM control signals into a plurality of voltage signals;
  separately converting the plurality of voltage signals into a plurality of current signals; and
  converting the plurality of current signals into a plurality of operation frequencies at different duty cycles.

By adopting the above technical solution, because of a positive correlation between the operation frequency and the output power of the switching power supply, a value of the voltage signal and a value of the current signal should be obtained first; when obtaining the frequency of the switching power supply controlled by each control signal, the PWM control signal of each control signal is first obtained, then the PWM control signal is converted into voltage signal, the voltage signal is converted into current signal, finally the operation frequency of the switching power supply controlled by each control signal is output, so that different SNR values are easy to be matched, and the switching power supply operation frequency of the maximum SNR value is found.

Optionally, obtaining a plurality of operation frequencies of the switching power supply at which the switching power supply is controlled by each of the plurality of control signals comprises:

separately obtaining a plurality of voltage signals;
separately converting the plurality of voltage signals into a plurality of current signals; and
converting the plurality of current signals into a plurality of operation frequencies at different duty cycles.

By adopting the above technical solution, when obtaining the voltage signal and the current signal of different control signals, the voltage signal can be directly obtained, and converted into current signal, finally a plurality of operation frequencies of the switching power supply at which the switching power supply is controlled by each of the plurality of control signals are output, so that different SNR values are easy to be matched, and the switching power supply operation frequency of maximum SNR value is found.

Optionally, before obtaining a SNR threshold, obtaining a SNR value of an AM/FM radio demodulator in real time, and comparing the SNR value with the SNR threshold, the method for adaptively adjusting frequency of a switching power supply includes:

obtaining a start signal of an AM/FM audio source input mode, and determining whether to obtain a SNR value of an AM/FM radio demodulator and compare the SNR value to the SNR threshold based on the start signal of the AM/FM audio source input mode;
obtaining a manual FM signal of an AM/FM mode, and determining whether to obtain a SNR value of the AM/FM radio demodulator and compare the SNR value to the SNR threshold based on the manual FM signal of the AM/FM mode; and
obtaining a periodic adjustment signal, and when a preset period for the periodic adjustment signal is reached, obtaining the SNR value of the AM/FM radio demodulator, and comparing the SNR value to the SNR threshold.

By adopting the above technical solution, when enter the step comparing the SNR value, a trigger conditions is needed, which can be a start of the AM/FM audio source input mode, a manual frequency adjustment of AM/FM mode, or the preset periodic adjustment signal. Therefore, the above three conditions should be detected in real time, when one condition is meet, the step comparing the SNR value is executed. After obtaining the start signal of the AM/FM audio source input mode, the step comparing the SNR value is executed, the optimum operation frequency of the switching power supply begins to be found; when the manual frequency adjustment of AM/FM mode is obtained, the step comparing the SNR value is executed as well; when the periodic adjustment signal of the preset time is obtained, the process finding out the optimum operation frequency is triggered, so that after the operation frequency drift of the switching power supply, the adaptive adjustment carries out in time, which adjusts the operation frequency to the optimum operation frequency.

In a second aspect, switching power supply frequency adaptive adjustment system provided in the present application adopts the following technical solution:

a switching power supply frequency adaptive adjustment system comprising:
a SNR value obtaining unit, configured to obtain a SNR value of an AM/FM radio demodulator in real time;
a control signal output unit, configured to output different control signals;
a comparing unit, configured to compare the preset SNR threshold to the SNR value obtained in real time, and when the SNR value is smaller than the SNR threshold, output a plurality of control signals to the switching power supply; and
a frequency obtaining unit, configured to obtain a plurality of operation frequencies of the switching power supply at which the switching power supply is controlled by each of the plurality of control signals;
wherein the comparing unit is further configured to compare a plurality of SNR values corresponding to the plurality of operation frequencies, to obtain a maximum SNR value; and wherein the system further comprises:
a switching power supply unit, configured to output a control signal corresponding to the maximum SNR value, and control the operation frequency of the switching power supply with the control signal; and
a timing unit, configured to obtain an adjustment period, and wherein the SNR value obtaining unit is further configured to obtain a SNR value of the AM/FM radio demodulator based on the adjustment period.

By adopting the above technical solution, the SNR value obtaining unit first obtains the SNR value of the AM/FM radio demodulator in real time, and the SNR value obtained in real time is compared to the preset SNR threshold by the comparing unit, the preset SNR threshold is set in advance; In particular, when the SNR value obtained in real time is smaller than the preset SNR threshold, then a plurality of control signals are output to the switching power supply by the control signal output unit, otherwise the SNR value obtaining unit continuously obtains the SNR value of the AM/FM radio demodulator in real time, the comparing unit continuously compares the SNR value obtained in real time to the preset SNR threshold, until the SNR value obtained in real time is smaller than the preset SNR threshold.

After the output of a plurality of control signals to the switching power supply by the control signal output unit, the frequency obtaining unit obtains a plurality of operation frequencies of the switching power supply at which the switching power supply is controlled by each of the plurality of control signals, at the same time the SNR value obtaining unit obtains the SNR value of the AM/FM radio demodulator of different control signals in real time, the comparing unit compares a plurality of SNR values to each other, to obtain the maximum SNR value, and the control signal corresponding to operation frequency of the maximum SNR value is output to the switching power supply unit, the switching power supply unit adopts the operation frequency of the control signal to work. In addition, in the period set by the timing unit, the SNR value obtaining unit is started to periodically adjust the operation frequency of the switching power supply.

In a third aspect, an electronic device adopting the system for adaptively adjusting frequency of a switching power supply provided in the present application, adopts the following technical solution:

an electronic device adopting the system for adaptively adjusting frequency of a switching power supply, comprising a micro controller, an AM/FM radio demodulation module, an audio amplifier module, an audio output module and a power module, wherein,
the micro controller, is coupled to the AM/FM radio demodulation module, audio amplifier module and the power module, and is configured to generate a switching power supply adjustment signal and output a control signal to the AM/FM radio demodulation module, the audio amplifier module and the power module; the micro controller is configured to implement the method for adaptively adjusting frequency of a switching power supply;

the AM/FM radio demodulation module is coupled to the audio amplifier module, and is configured to receive an external radio signal, and after the radio signal is converted into an audio signal, transmit the audio signal to the audio amplifier module;

the audio amplifier module is coupled to the audio output module, and is configured to receive and amplify the audio signals output by the AM/FM radio demodulation module, and output the amplified audio signal to the audio output module;

the audio output module is configured to receive the amplified audio signal from the audio amplifier module, and output the amplified audio signal;

the power module is configured to supply power to the micro controller, the AM/FM radio demodulation module, the audio amplifier module and the audio output module.

By adopting the above technical solution, after the generation of switching power supply adjustment signal by the micro controller, the current SNR value of the AM/FM radio demodulation module is read and determined whether it is greater than the SNR threshold; if the current SNR value is smaller than the preset SNR threshold, the micro controller enter switching power supply frequency automatic adjustment mode, a plurality of control signals are output to the power module by the micro controller, the operation frequency of the power module is adjusted to the operation frequency of highest SNR value in the period of the cycle, the interference of the electromagnetic radiation caused by the switching power supply in the broadcast receiver is decreased, audio quality from the broadcast receiver is improved. The AM/FM radio demodulation module receives radio signal, the radio signal is converted into audio signal, and the audio signal is output to the audio amplifier module to be amplified, finally the amplified audio signal is output by the audio output module.

Optionally, the power module comprises a rectification filter unit coupled to external power, a voltage regulating unit and a stabilized voltage power supply unit, and wherein the rectification filter unit is coupled to the voltage regulating unit, and is configured to rectificate the external power to DC high voltage and transmit the DC high voltage to the voltage regulating unit; the voltage regulating unit is coupled to the stabilized voltage power supply unit, and is configured to convert the DC high voltage into a high frequency low voltage and transmit the high frequency low voltage to the stabilized voltage power supply unit, the stabilized voltage power supply unit is configured to supply power to the micro controller, the AM/FM radio demodulation module, the audio amplifier module and the audio output module.

By adopting the above technical solution, the external power is coupled to the circuit, the alternating current of the external power is filtered by the rectification filter unit and rectificated to the DC high voltage, the DC high voltage is converted into the high frequency low voltage by the voltage regulating unit, and which is in stabilized voltage adjustment to be the required electric power by the stabilized voltage power supply unit, so that the power can be supplied to units that need different voltages.

Optionally, an electric signal conversion unit is coupled between the micro controller and the voltage regulating unit, and the electric signal conversion unit is configured to convert the control signal output by the micro controller into a current signal, and the voltage regulating unit is further configured to convert the current signal into an operation frequency control signal for changing an operation frequency of the power module.

By adopting the above technical solution, because the output power of the power module drifts as the output power of the audio output unit changes, the operation frequency of the voltage regulating unit should be adjusted by the micro controller, however, the voltage regulating unit cannot be directly controlled by the control signal output by the micro controller, so the electric signal conversion unit should be connected between the micro controller and the voltage regulating unit, the control signal is converted into the current signal by the electric signal conversion unit, so that the operation frequency converted from the current signal controls the power module, the operation frequency of the power module is maintained in high SNR value, the interference of the power module in the audio output module is reduced.

Optionally, the electric signal conversion unit comprises a voltage conversion sub-unit, a current conversion sub-unit and an isolation sub-unit, and wherein the voltage conversion sub-unit is coupled to the micro controller, configured to convert the PWM signal output by the micro controller into a voltage signal; the current conversion sub-unit is coupled to the isolation sub-unit, and is configured to convert a voltage signal into a current signal; the isolation sub-unit is coupled to the voltage regulating unit, and is configured to transmit an isolated current signal to a voltage regulating unit.

By adopting the above technical solution, when the operation frequency of the voltage regulating unit is adjusted by the micro controller, the micro controller first outputs the PWM control signal to the voltage conversion sub-unit, after the voltage signal being converted from the control signal by the voltage conversion sub-unit, it is converted into the current signal by the current conversion sub-unit, finally the current signal is output to the voltage regulating unit through the isolation sub-unit, so that the control of the voltage regulating unit by the micro controller is realized.

Optionally, the electric signal conversion unit comprises a current conversion sub-unit and an isolation sub-unit, and wherein the current conversion sub-unit is coupled to the micro controller and the isolation sub-unit, and is configured to convert a voltage signal into a current signal and transmit the current signal to the isolation sub-unit; the isolation sub-unit is coupled to the voltage regulating unit, and is configured to transmit the isolation current signal to the voltage regulating unit.

By adopting the above technical solution, while the micro controller is controlling the operation frequency of the voltage regulating unit, the micro controller can directly output voltage signal, the current signal is converted from the voltage signal by the current conversion sub-unit, which is finally output to the voltage regulating unit by the isolation sub-unit, so that the control of the voltage regulating unit by the micro controller is realized.

In summary, the present application can achieve at least one of the following beneficial technical effects:

With the comparison between the real time SNR value of the AM/FM radio demodulator and the SNR threshold, a plurality of control signals are output in certain period of cycle to sequentially control the switching power supply, and the SNR value and the operation frequency corresponding to each control signal are obtained, then the switching power supply is controlled with the operation frequency of the maximum SNR value in certain period of cycle, so that the frequency of the switching power supply in certain period of cycle can be the optimum frequency.

With the setting of the electric signal conversion unit, when different micro controllers output different control signals, different control signals can be converted into the current signals which can be recognized and received by the voltage regulating unit, the control of the voltage regulating unit is easy to be realized, and the operation frequency and the SNR value of the voltage regulating unit corresponding to different control signals are easy to be obtained, so that the operation frequency of the maximum SNR value in certain period of the cycle is further obtained.

BRIEF DESCRIPTION OF THE DRAWINGS

FIG. 1 is a flow chart of a method for adaptively adjusting frequency of a switching power supply according to an embodiment 1 of the present application;

FIG. 2 is a schematic diagram of a trigger condition for initiating a automatic adjustment mode of the switching power supply frequency according to the embodiment 1 of the present application;

FIG. 3 is a flow chart of acquiring a frequency according to the embodiment 1 of the present application;

DESCRIPTION OF THE EMBODIMENTS

Figure 4:
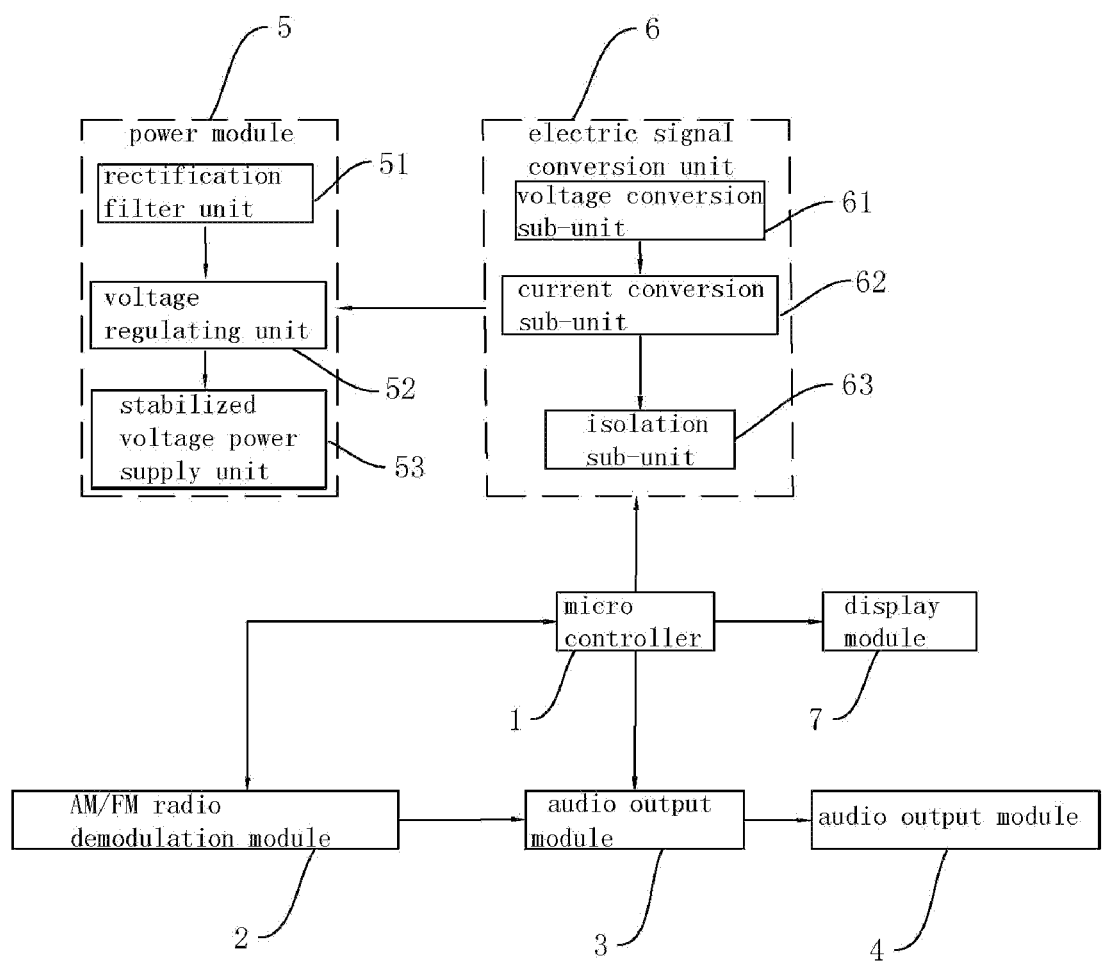
FIG. 4 is a schematic block diagram of an electronic device for the frequency adaptive adjustment method according to the embodiment 1 of the present application.

The present application will be further described in detail.

Embodiment 1

In a first aspect, a method for adaptively adjusting frequency of a switching power supply is provided according to an embodiment in the present application, which is applied to a system for adaptively adjusting frequency of a switching power supply. With reference to FIG. 1, the method may include the following steps.

S1, a step of SNR value comparison: obtaining a SNR threshold, obtaining a SNR value of an AM/FM radio demodulator in real time, and comparing the SNR value with the SNR threshold; S2, a step of sending a control signal: when the SNR value of the AM/FM radio demodulator is smaller than the SNR threshold, outputting a plurality of control signals to the switching power supply, and obtaining a plurality of operation frequencies of the switching power supply at which the switching power supply is controlled by each of the plurality of control signals. S3, the step of obtaining the maximum SNR value: obtaining a plurality of SNR value of the AM/FM radio demodulator at each of the plurality of operation frequencies, and obtaining a maximum SNR value among the plurality of SNR values. S4, the step of the control of the switching power supply: outputting a control signal corresponding to the maximum SNR value, and controlling the operation frequency of the switching power supply with the control signal. And S5, the step of periodic adjustment: periodically obtaining a SNR value of the AM/FM radio demodulator at a preset time period, and comparing the SNR value to the SNR threshold, so the interference of the switching power supply in the broadcast receiver is reduced, audio quality from the broadcast receiver is improved.

Since the steps S1-S4 is an automatic adjustment to the operation frequency of the switching power supply, that is, the steps S1-S4 can be defined as switching power supply frequency automatic adjustment mode, when there is an adaptive adjustment among them, the step of SNR value comparison should be triggered, to start the switching power supply frequency automatic adjustment mode, referring to FIG. 2, obtaining the switching power supply adjustment signal to start the switching power supply frequency automatic adjustment mode in the present application includes:

S01: obtaining a start signal of an AM/FM audio source input mode, and determining whether to obtain a SNR value of the AM/FM radio demodulator and compare the SNR value to the SNR threshold based on the start signal of the AM/FM audio source input mode;

S02: obtaining a manual FM signal of an AM/FM mode, and determining whether to obtain a SNR value of the AM/FM radio demodulator and compare the SNR value to the SNR threshold based on the manual FM signal of AM/FM mode;

S03: obtaining a periodic adjustment signal, and when a the preset period for the periodic adjustment signal is reached, obtaining the SNR value of the AM/FM radio demodulator, comparing the SNR value with the SNR threshold.

In particular, the AM/FM audio source input mode is a radio reception working mode of the AM/FM broadcast receiver. After obtaining the signals in the above S01, S02 and S03, the switching power supply frequency automatic adjustment mode is started, the switching power supply is made to keep working on the operation frequency of the maximum SNR value in the certain period of the cycle, in which the periodic adjustment signal is an adjustment signal generated in preset period of the cycle.

It is explained that, when one of the signals in above S01, S02 and S03 is received, the switching power supply automatic adjustment mode is trigger to start; For example:

When the manual FM signal of AM/FM mode is obtained at any moment of the preset period of the cycle, the switching power supply automatic adjustment mode is started.

When the last switching power supply automatic adjustment mode is finished, if the manual FM signal of AM/FM mode is immediately obtained, the switching power supply automatic adjustment mode can still be triggered immediately to start;

After the end of the last switching power supply automatic adjustment mode, the period of the cycle refreshes, the time of the end of the last switching power supply automatic adjustment mode is being as a starting time:

In the process of obtaining the frequency, referring to FIG. 3, the following steps are included:

S301: separately obtaining a plurality of PWM control signals at different duty cycles; S302: separately converting the plurality of PWM control signals into a plurality of voltage signals; S303: separately converting the plurality of voltage signals into a plurality of current signals; and S304: converting the plurality of current signals into a plurality of operation frequencies at different duty cycles.

In the process of obtaining the control signal of the maximum SNR value, a group of experimental data is exampled to illustrate, referring to char 1, in present embodiment, 10 PWM control signals are output to the switching power supply, after the process of obtaining the frequency, 10 operation frequencies of the switching power supply are obtained, and SNR values corresponding to different operation frequencies are obtained, then the 10 SNR values are compared to obtain the maximum SNR value. For example, the SNR value in 25 db, is corresponded to output a PWM control signal for 56% duty cycle, and the switching power supply will be controlled with the PWM control signal in next period of cycle, so that the radio reception interference of the switching power supply in the broadcast receiver is decreased. The data is provided for illustration, the PWM control signal can be a plurality, and can be a plurality of groups of control signals, the maximum SNR value is finally obtained.

CHART 1

| duty cycle of PWM output by MCU | Frequency of the switching power supply | SNR value |
| --- | --- | --- |
| 32% | 54 KHZ | 23 |
| 35% | 55 KHZ | 22 |
| 38% | 56 KHZ | 25 |
| 41% | 57 KHZ | 19 |
| 44% | 58 KHZ | 23 |
| 47% | 59 KHZ | 20 |
| 50% | 60 KHZ | 20 |
| 53% | 61 KHZ | 22 |
| 56% | 62 KHZ | 25 |
| 59% | 63 KHZ | 21 |
| ... | ... | ... |

The implementation principle of the method for adaptively adjusting frequency of a switching power supply according to embodiment in the present application is that: Firstly, the SNR threshold is manually set in the system to make the system obtain the SNR threshold; then the real time SNR value of the AM/FM radio demodulator is obtained, and is compared with the SNR threshold; when the SNR value of the AM/FM radio demodulator is smaller than the SNR threshold, a plurality of control signals control the switching power supply in sequence, the SNR value and the operation frequency are obtained when each control signal controls, and the switching power supply is controlled with the operation frequency of the maximum SNR value in a certain period of the cycle, so that the frequency of the switching power supply can be the optimum frequency in a certain period of the cycle. In addition, by periodically repeating the method, the switching power supply is adaptively adjusted to the frequency of maximum SNR value, so that the interference of the switching power supply in the broadcast receiver is reduced, and audio quality from the broadcast receiver is improved.

When used by the user, the radio device is started, the AM/FM audio source input mode is started as well, the radio device adaptively adjusts the frequency of the switching power supply, the effect of radio reception is adjusted, and audio quality from the broadcast receiver is improved. When the frequency of the radio device is manually tuned by the user, the radio device adaptively adjusts the frequency of the switching power supply as well, and audio quality from the broadcast receiver is automatically improved. Also, the frequency of the switching power supply of the radio device is periodically adjusted, so that the audio frequency continuously output by the radio device is in high quality.

In a second aspect, the embodiment in the present application discloses a switching power supply frequency adaptive adjustment system, including: a SNR value obtaining unit, configured to obtain a SNR value of an AM/FM radio demodulator in real time; a control signal output unit, configured to output different control signals; a comparing unit, configured to compare the preset SNR threshold to the SNR value obtained in real time, and when the SNR value is smaller than the SNR threshold, output a plurality of control signals to the switching power supply; a frequency obtaining unit, configured to obtain a plurality of operation frequencies of the switching power supply at which the switching power supply is controlled by each of the plurality of control signals; in particular, the comparing unit is further configured to compare a plurality of SNR values corresponding to the plurality of operation frequencies, to obtain a maximum SNR value; and particularly the system further includes: a switching power supply unit, configured to output a control signal corresponding to the maximum SNR value, and control the operation frequency of the switching power supply with the control signal; and a timing unit, configured to obtain an adjustment period, particularly the SNR value obtaining unit is further configured to obtain a SNR value of the AM/FM radio demodulator based on the adjustment period.

The implementation principle of the switching power supply frequency adaptive adjustment system of the embodiment in the present application is that: the SNR value obtaining unit firstly obtains the SNR value of the AM/FM radio demodulator, and the SNR value obtained in real time is compared with the SNR threshold set in advance by the comparing unit;

In particular, when the SNR value obtained in real time is smaller than the preset SNR threshold, then the plurality of control signals are output to the switching power supply by the control signal output unit; otherwise the SNR value obtaining unit continuously obtains the SNR value of the AM/FM radio demodulator in real time, the comparing unit continuously compares the SNR value obtained in real time to the preset SNR threshold, until the SNR value obtained in real time is smaller than the preset SNR threshold.

After the output of a plurality of control signals to the switching power supply by the control signal output unit, the frequency obtaining unit separately obtains a plurality of operation frequencies of the switching power supply at which the switching power supply is controlled by each of the plurality of control signals, at the same time when the SNR value obtaining unit obtains the SNR value of the AM/FM radio demodulator of different control signals in real time, the comparing unit compares the a plurality of SNR values, to obtain the maximum SNR value, and the control signal with operation frequency corresponding to the maximum SNR value is output to the switching power supply unit, the switching power supply unit adopts the operation frequency of the control signal to work. In addition, in the period set by the timing unit, the SNR value obtaining unit is started to periodically adjust the operation frequency of the switching power supply.

In a third aspect, the embodiment in the present application discloses an electronic device adopting the system for adaptively adjusting frequency of a switching power supply, referring to FIG. 4, including a micro controller 1 (MCU), an AM/FM radio demodulation module 2, an audio amplifier module 3, an audio output module 4 and a power module 5, in particular: the micro controller 1 is coupled to the AM/FM radio demodulation module 2, the audio amplifier module 3 and the power module 5, and is configured to generate a switching power supply adjustment signal, and output a control signal to the AM/FM radio demodulation module 2, the audio amplifier module 3 and the power module 5, the micro controller 1 is configured to implement the method for adaptively adjusting frequency of a switching power supply; the AM/FM radio demodulation module 2 is coupled to the audio amplifier module 3, and is configured to receive radio signals, and convert the radio signals into an audio signals; the audio amplifier module 3 is coupled to the audio output module 4, and is configured to receive and amplify the audio signals output by the AM/FM radio demodulation module, and output the amplified audio signal to the audio output module 4; the audio output module 4 is configured to receive amplified audio signal from the audio amplifier module 3, and output the amplified audio signal; the power module 5 is configured to supply power to the micro controller 1, the AM/FM radio demodulation module 2, the audio amplifier module 3 and the audio output module 4.

The audio amplifier module 3 can be a power amplifier, it can also be other input source of audio frequency device like digital processor DSP, electronic switch and so on, the power amplifier is adopted in the embodiment of the present application; because the embodiment is applied in large scale environment like construction site and so one, the audio output module 4 adopts horn; The MCU is coupled to a display module 7, the display module 7 is configured to display the information output by the MUC, like frequency modulation, radio frequency, period of cycle and so on, liquid crystal displayer is adopted in the present application.

After the reception of the start signal of AM/FM audio source input mode, manual FM signal of AM/FM mode or periodic adjustment signal by the MCU, the current SNR value of the AM/FM radio demodulation module 2 is read and greater than the SNR threshold, the MCU enters the switching power supply frequency automatic adjustment mode, a plurality of PWM control signals are output to the power module 5 by the MCU, the operation frequency of the power module 5 is adjusted to the operation frequency of the highest SNR value in period of cycle, the power module 5 supplies required power to the whole device in a operation frequency with minimum interference, the interference of the electromagnetic radiation caused by the power module 5 is decreased in the broadcast receiver, audio quality from the broadcast receiver is improved. The AM/FM radio demodulation module 2 receives the radio signal, the radio signal is converted into the audio signal (weak electronic sine wave signal), and the power amplifier amplifies the weak electronic sine wave signal, which is finally output by the horn.

Referring to FIG. 4, the power module 5 includes a rectification filter unit 51 coupled to external power, a voltage regulating unit 52 and a stabilized voltage power supply unit 53, and in which the rectification filter unit 51 is coupled to the voltage regulating unit 52, and is configured to rectificate the external power to DC high voltage and transmit the DC high voltage to the voltage regulating unit 52; the voltage regulating unit 52 is coupled to the stabilized voltage power supply unit 53, and is configured to convert the DC high voltage to a low voltage and transmit the low voltage to the stabilized voltage power supply unit 53, the stabilized voltage power supply unit 53 supplies stabilizing voltage power according to different power supply types.

Figure 5A:
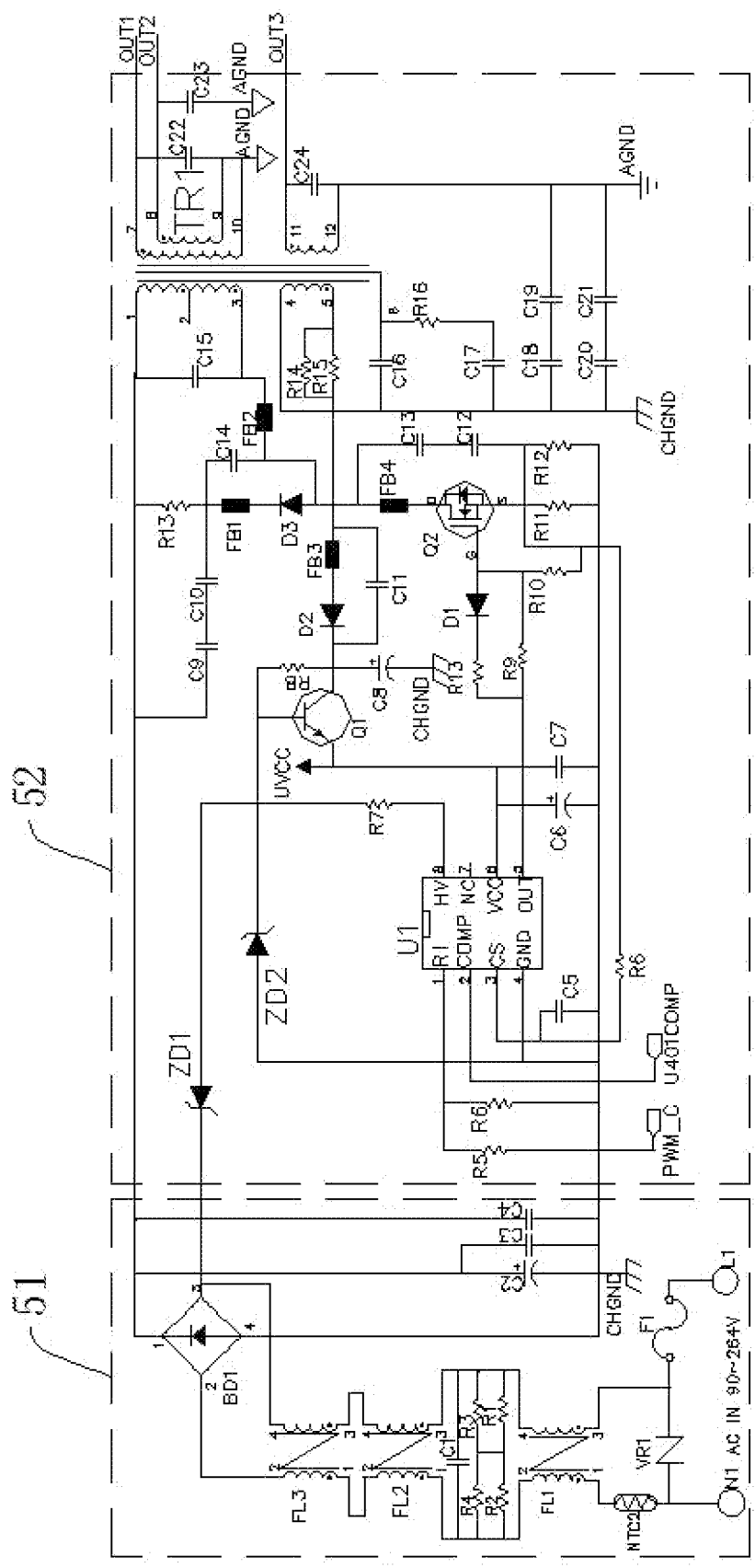
FIGS. 5A and 5B are a schematic circuit structure diagram of a power module according to the embodiment 1 of the present application.
Figure 5B:
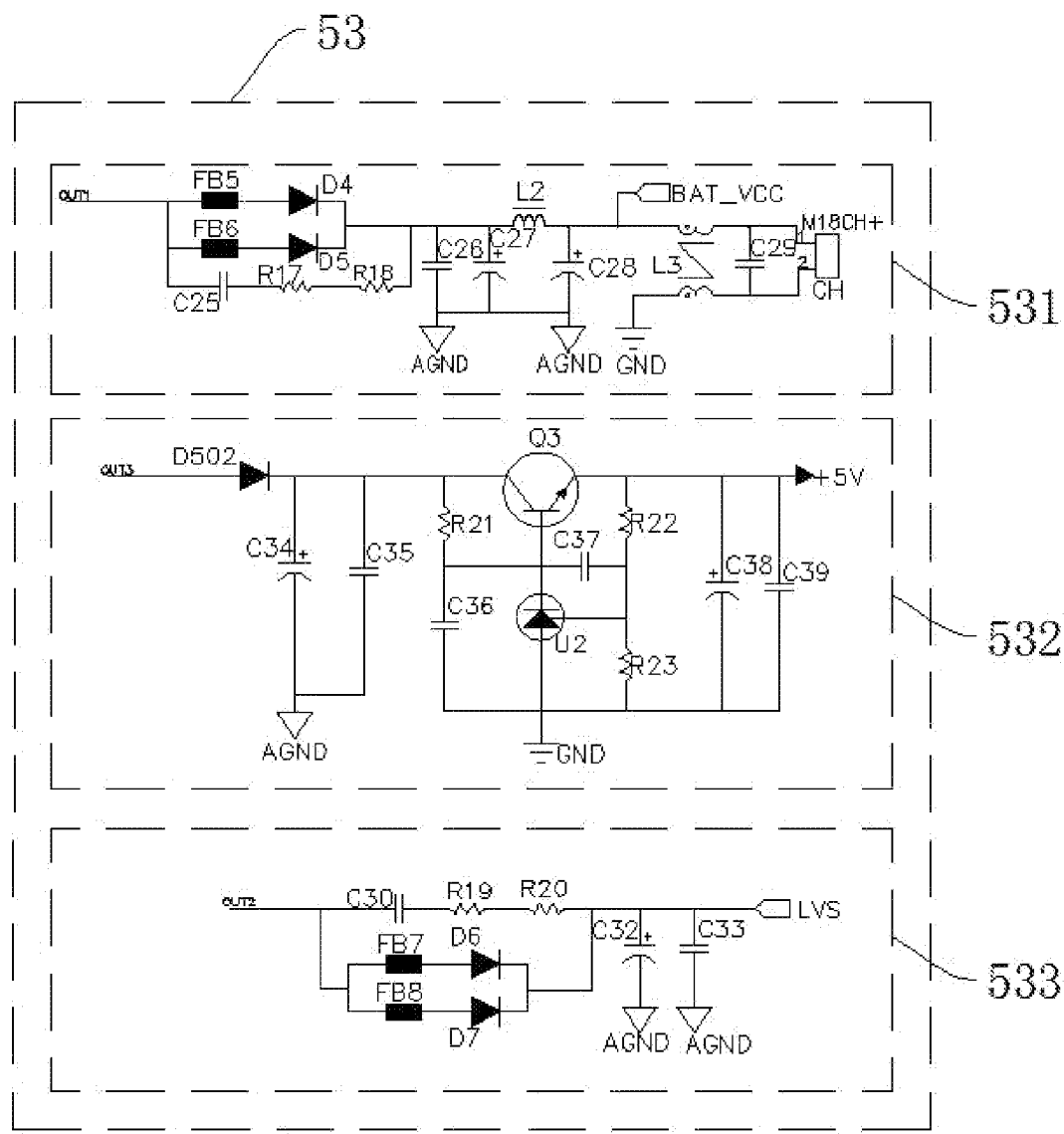

After the connection to the circuit of the external power, the alternating current of the external power is filtered and rectificated to the DC high voltage by the rectification filter unit 51, the FIG. 5A and FIG. 5B is referred for specific circuit structure, the zero line terminal of AC urban power (N1) is coupled to potentiometer VR1, the other end of the potentiometer VR1 is coupled to fuse F1, the other end of the fuse F1 is couple to the wire terminal of AC urban power (L1), the fuse F1 is coupled to a thermistor NTC2, when a input voltage is higher than the trigger voltage of the thermistor NTC2, the thermistor NTC2 operates, the fuse F1 is blown, so that the whole circuit is protected. The two ends of the potentiometer VR1 are successively connected in parallel with electromagnetic interference (EMI) filters FL1, FL2, FL3, through the multistage filtering of the EMI filters FL1, FL2, FL3, the electromagnetic interference signal is suppressed. A first filter circuit is provided between the EMI filter FL1 and the EMI filter FL2, the first filter circuit consists of resistance R1, R2, R3, R4 and capacitance C1 that are in parallel connection, the impedance of the high frequency electrical signal is decrease. The end of the EMI filter FL3 away from the AC mains is provided with a bridge rectifier BD1 and a second filter circuit, the second filter circuit is in parallel connection with the end of the bridge rectifier BD1 away from the EMI filter FL3; The second filter circuit in the present application consists of a electrolytic capacitor C2, and ceramic capacitor C3,C4 that are in parallel connection, electrolytic capacitor C2 is in parallel connection with the end 1 and the end 4 of the bridge rectifier BD1, the ceramic capacitor C3,C4 are in parallel connection with the electrolytic capacitor C2, the cooperation of two types of capacitors in the second filter circuit absorbs and suppresses the interference of high and low frequency, the effect of filtering is improved. After the EMI filters FL1, FL2, FL3 filtering in multi stage, the urban power is converted into DC high voltage by the rectification of the bridge rectifier BD1 and the filtering of the second filter circuit.

The DC high voltage is converted into high frequency low voltage by the voltage regulating unit 52, the voltage regulating unit 52 mainly consists of a pulse width modulation switching circuit, a switch type FET circuit and a high frequency transformer circuit, pulse width modulation switching circuit controls the on and off of the FET Q2 in the switch type FET circuit by changing the duty cycle, so that the DC high voltage is supplied to the primary coil of the transformer TR1 in the high frequency transformer circuit, then the secondary coil of the transformer TR1 induces high frequency low voltage.

The high frequency low voltage is in voltage stabilization and adjustment by the stabilized voltage power supply unit 53 to supply power, the stabilized voltage power supply unit 53 includes three groups of different rectification filter circuit. In particular, in order to continuously receive power supply by the broadcast receiver when the urban power is cut off, the power module 5 also includes energy storing unit, the energy storing unit in the present application is a lithium battery, the lithium battery receives the electric energy of the stabilized voltage power supply unit 53, and supplies power to the broadcast receiver when the urban power is cut off; Therefore, one way of the stabilized voltage power supply unit 53 is a first electronic supply unit 531, the first electronic supply unit 531 provides charging voltage BAT to the lithium battery after the rectification and the filter of the rectifier diode and the filter capacitor; The other way is a second electronic supply unit 532, a +5V supply voltage is provided after the rectification and the filter of the rectifier diode and the filter capacitor; Another way is a third electronic supply unit 533, which is to provide voltage LVS to the broadcast receiver device.

Referring to FIG. 4, an electric signal conversion unit 6 is coupled between the micro controller 1 and the voltage regulating unit 52, and the electric signal conversion unit 6 is configured to convert the control signal output by the micro controller 1 into the current signal, and the voltage regulating unit 52 is further configured to convert the current signal into the operation frequency control signal. The electric signal conversion unit 6 includes a voltage conversion sub-unit 61, a current conversion sub-unit 62 and an isolation sub-unit 63, and in particular, the voltage conversion sub-unit 61 is coupled to the micro controller 1, and is configured to convert the PWM signal output by the micro controller 1 into a voltage signal; the current conversion sub-unit 62 is coupled to the isolation sub-unit 63, and is configured to convert a voltage signal into a current signal; the isolation sub-unit 63 is coupled to the voltage regulating unit 52, and is configured to transmit an isolation current signal to a voltage regulating unit 52, in particular, the isolation sub-unit 63 adopts optical coupler to isolate.

Figure 6:
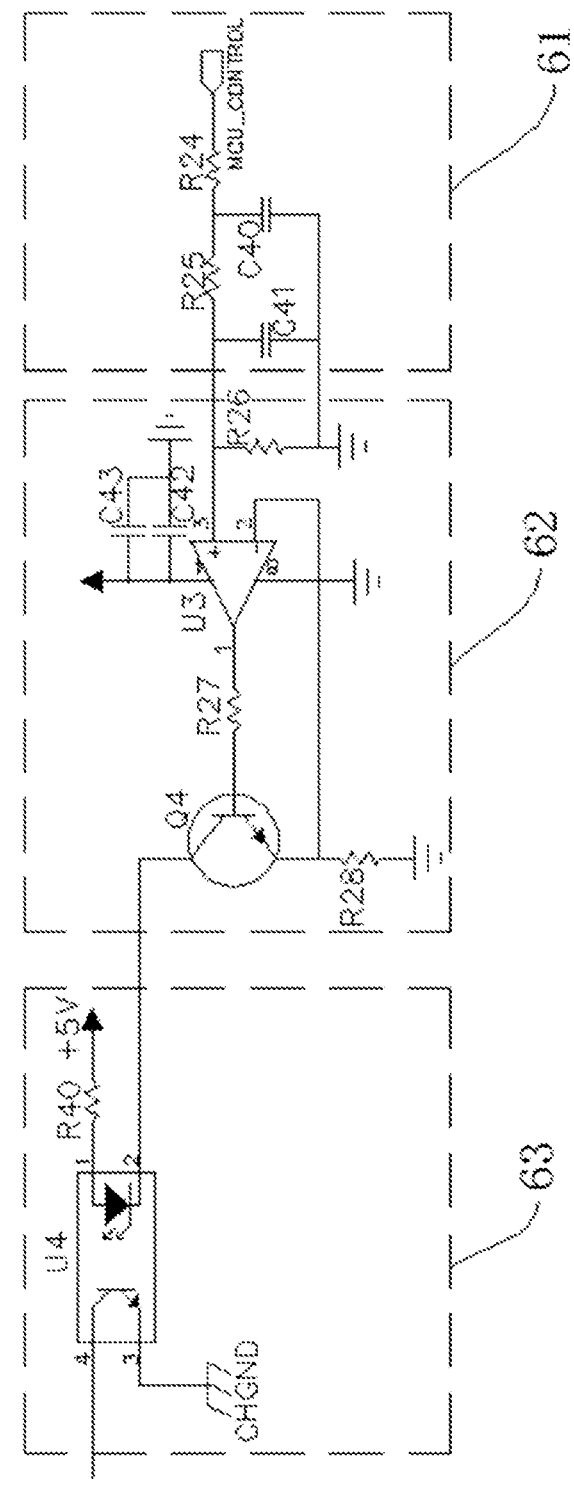
FIG. 6 is a schematic circuit structure diagram of an electric signal conversion unit according to the embodiment 1 of the present application.
Figure 7:
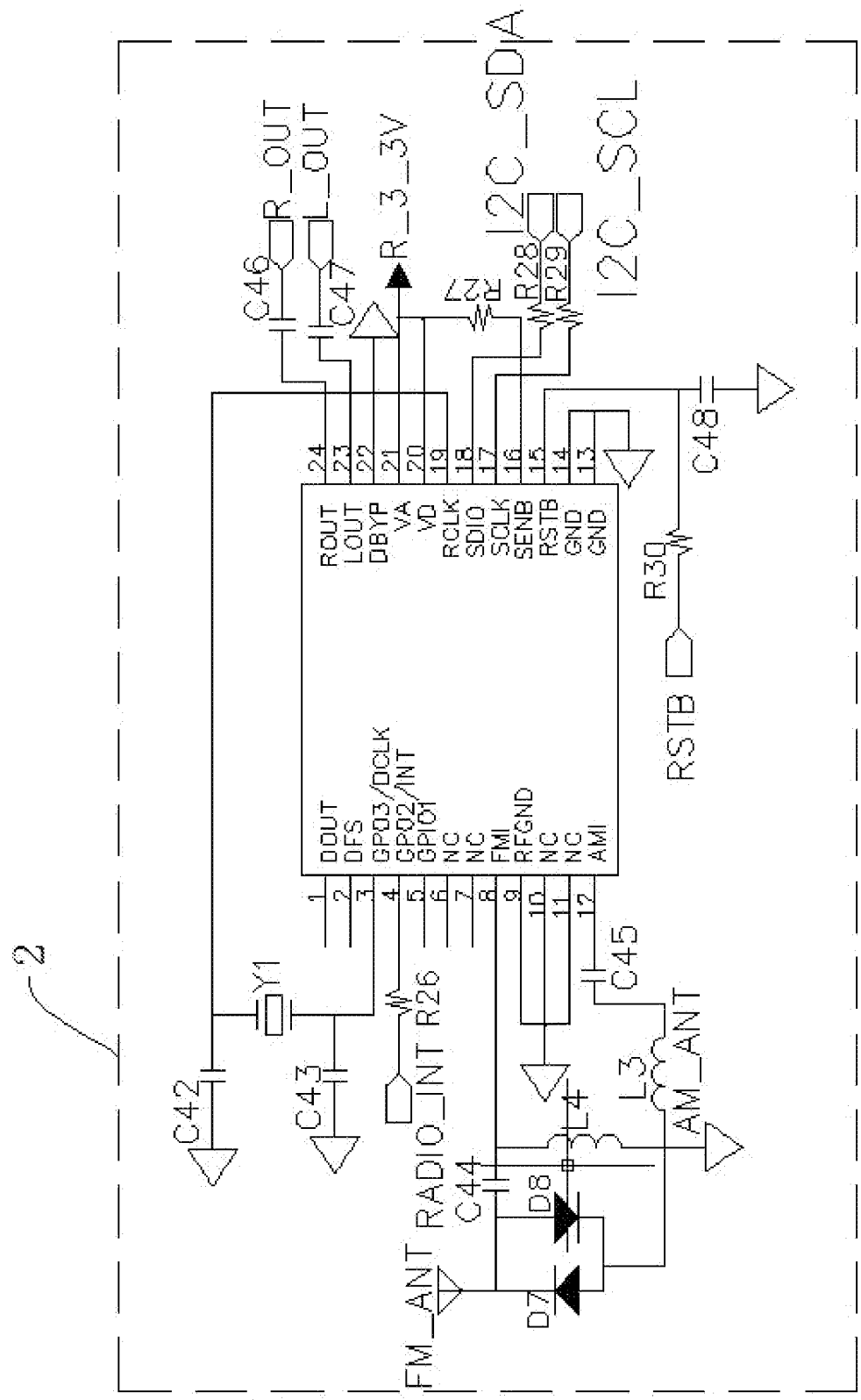
FIG. 7 is a schematic circuit structure diagram of an AM/FM radio demodulation module according to the embodiment 1 of the present application.

Referring to FIG. 6, the voltage conversion sub-unit 61 is a RC filter circuit that mainly consists of a plurality of capacitance and resistance, which is configured to convert the PWM signal output by the micro controller 1 into the voltage signal; In the present embodiment, the RC filter circuit consists of resistance R24, R25 and capacitance C40, C41, in which one end of the resistance R24 is coupled to the signal output pin MCU-CONTROL of the micro controller 1, the other end is coupled to one end of the capacitance C40, the other end of the capacitance C40 grounds; one end of the resistance R25 is coupled to the end of the resistance R24 away from the signal output pin MCU-CONTROL of the micro controller 1, the other end is coupled to the one end of the capacitance C41, the other end of the capacitance C41 grounds. The current conversion sub-unit 62 mainly consists of a operational amplifier U3 and a triode Q4, in which the positive input terminal of the operational amplifier U3 is coupled to the end of the resistance R25 away from the resistance R24 in RC filter circuit, the negative input terminal of the operational amplifier U3 grounds, the output terminal of the operational amplifier U3 is coupled to the base B of the triode Q4, the emitter E of the triode Q4 grounds through the resistance R28, the collector C is coupled to the photoelectric coupler U4, the triode Q4 is configured to act as a voltage follower. The voltage signal is amplified by the operational amplifier U3 and output to the triode Q4 to be in a current amplification, which is converted into a current signal.

While the maximum SNR value of the broadcast receiver in unit time is being obtained, 10 PWMs (PWM1 . . . PWM10) at different duty cycles are successively output by the MCU, the PWM signals are converted into voltage signals (V1 . . . V10) by the RC filter circuit, and the voltage signals are converted into different current signals (A1 . . . A10) by the operational amplifier U3 and the triode Q4, then the signals are output to the pulse width modulation switching circuit by the photoelectric coupler U4. The pulse width modulation switching circuit successively outputs different frequencies (F1 . . . F10) to the MCU.

At the time when the MCU outputs different duty cycles, the signal-to-noise ratio SNR values of the radio station received by the AM/FM broadcast receiver are separately read, and the maximum of the SNR values in 10 groups is found out. The PWM corresponding to the maximum SNR value is stably output to the pulse width modulation switching circuit by the MCU. The switching power supply stably works on the operation frequency of maximum SNR value, so that the interference of the switching power supply in the broadcast receiver is decreased.

The implementation principle of the method for adaptively adjusting frequency of a switching power supply according to embodiment of the present application is that: after the multistage filter of EMI filter FL1,FL2,FL3 to the external power, the urban power is converted into DC high voltage by the rectification of the bridge rectifier BD1 and the filter of the second filter circuit, the duty cycle of the DC high voltage is changed by the pulse width modulation switching circuit to control the on and off of the FET Q2, the DC high voltage is supplied to the primary coil of the transformer TR1, so that the secondary coil of the transformer TR1 induces high frequency low voltage, after the high frequency low voltage passing through the first electronic supply unit 531, the second electronic supply unit 532 and the third electronic supply unit 533, the charging voltage of lithium battery BAT, the supply voltage +5V, and the broadcast receiver supply voltage LVS are output.

PWM signals at different duty cycles are successively output by the MCU, the PWM signals are converted into voltage signals by the RC filter circuit, and the voltage signals are converted into different current signals by the operational amplifier U3 and the triode Q4, then the signals are output to the pulse width modulation switching circuit by the photoelectric coupler U4. Signals with different frequencies are successively output to the MCU by the pulse width modulation switching circuit. At the time when the MCU outputs different duty cycle, the signal-to-noise ratio SNR values of the radio station received by the AM/FM broadcast receiver are separately read, and the maximum of the SNR value is found out. The PWM corresponding to the maximum SNR value is stably output to the pulse width modulation switching circuit by the MCU, so that the switching power supply stably works on the operation frequency of maximum SNR value.

Embodiment 2

Figure 8:
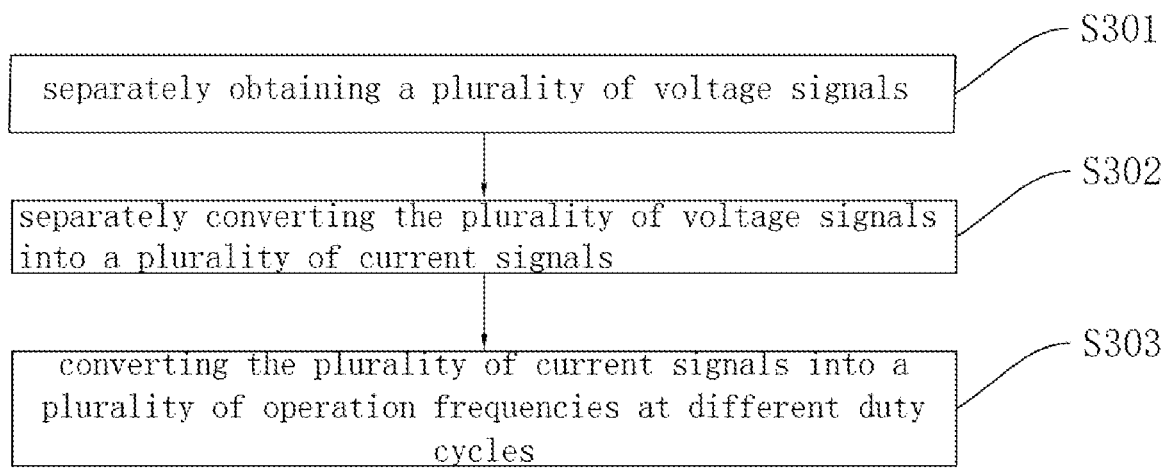
FIG. 8 is a flow chart of acquiring a frequency according to an embodiment 2 of the present application.

In a first aspect, a method for adaptively adjusting frequency of a switching power supply is disclosed in embodiment of the present application, the difference between the present embodiment and embodiment 1 is that, referring to FIG. 8, in the process of obtaining the frequency, the following step is included:

S301: separately obtaining a plurality of voltage signals;
S302: separately converting the plurality of voltage signals into a plurality of current signals; and
S303: converting the plurality of current signals into a plurality of operation frequencies at different duty cycles.

In the present embodiment, the voltage signal is directly obtained, the PWM control signal has no need to be in processing, which is converted into voltage signal before being output.

The implementation principle of a method for adaptively adjusting frequency of a switching power supply according to the embodiment of the present application is that: the SNR threshold is firstly to be set; then the real time SNR value of the AM/FM radio demodulator is obtained, and compared with the SNR threshold; when the SNR value of the AM/FM radio demodulator is smaller than the SNR threshold, a plurality of control signals separately control the switching supply power, the SNR value and the voltage signal corresponding to each control signal are obtained, and the voltage control signal is converted into current signal, finally the operation frequency signal is output; the SNR values are compared, then the operation frequency of the maximum SNR value is adopted to control the switching power supply, so that the frequency of the switching power supply can be the optimum frequency in a certain period of cycle; and by periodically repeating the method, the switching power supply is periodically adaptively adjusted to the frequency of maximum SNR value, so that the interference of the switching power supply in the broadcast receiver is decreased, audio quality from the broadcast receiver is degraded.

Figure 9:
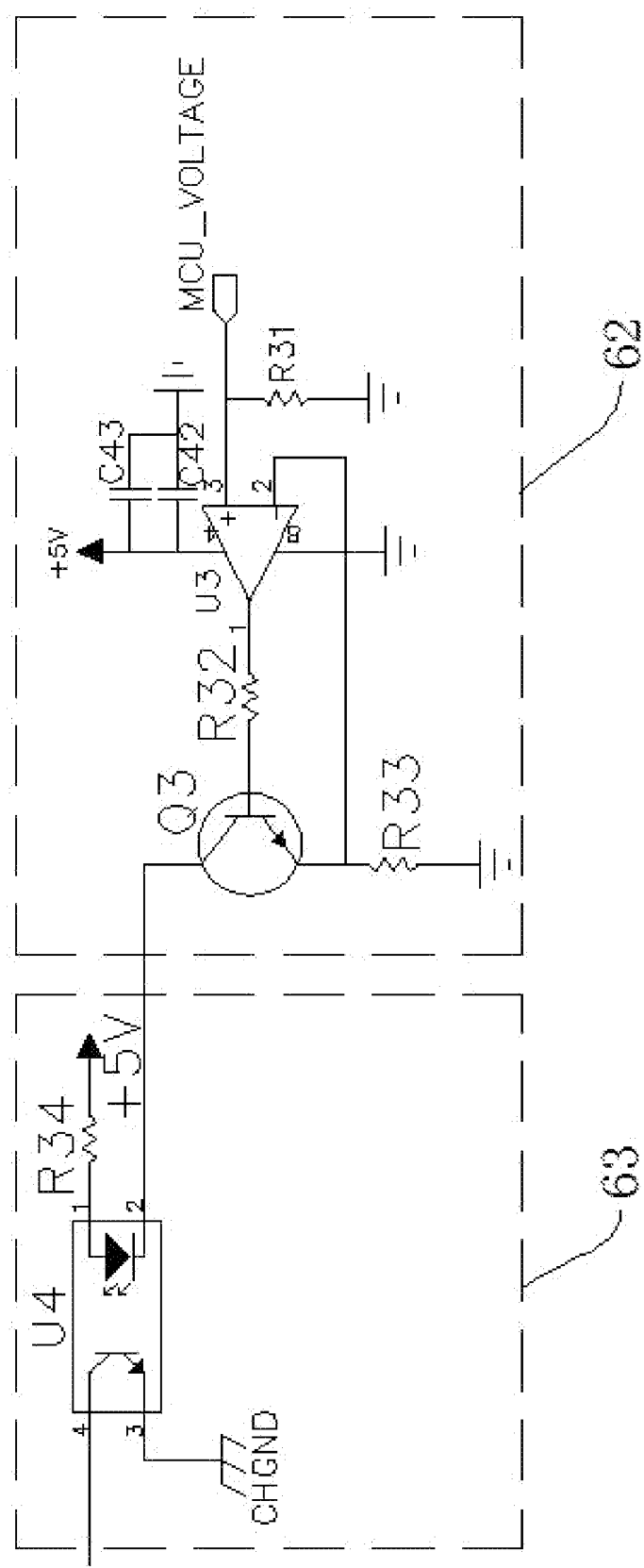
FIG. 9 is a schematic circuit structure diagram of an electric signal conversion unit according to the embodiment 2 of the present application.

In a second aspect, an electronic device adopting the frequency adaptive adjustment method is disclosed in the embodiment of the present application, referring to FIG. 9, the difference between the present embodiment and the embodiment 1 is that, the electric signal conversion unit 6 includes a current conversion sub-unit 62 and an isolation sub-unit 63, the current conversion sub-unit 62 is coupled to the micro controller 1 and the isolation sub-unit 63, and is configured to convert the voltage signal into the current signal, and transmit the current signal to the isolation sub-unit 63, the isolation sub-unit 63 is coupled to the voltage regulating unit 52, and is configured to transmit the isolation current signal to the voltage regulating unit 52.

When the maximum SNR value of the broadcast receiver in unit time is obtained, 10 different voltages (v1 . . . V10) are successively output by the MCU, and the voltage signals are converted into different current signals (A1 . . . A10) by the operational amplifier U3 and the triode Q4, and the signal is transmitted to the pulse width modulation switching circuit by the photoelectric coupler U4. The pulse width modulation switching circuit successively outputs different frequencies (F1 . . . F10) to MCU.

When the MCU outputs different duty cycle, the AM/FM broadcast receiver may separately read signal-to-noise ratio SNR values of the radio, and find the maximum from 10 groups of SNR values. The PWM corresponding to the maximum SNR value is stably output to the pulse width modulation switching circuit by the MCU. The switching power supply stably works on the operation frequency of maximum SNR value, so that the interference of the switching power supply in the broadcast receiver is decreased.

The implementation principle of an electronic device adopting the method for adaptively adjusting frequency of a switching power supply according to embodiment of the present application is that: While the frequency output by the power module 5 is being controlled, MCU successively outputs different voltage signals, the voltage signals are converted into different current signals by the operational amplifier U3 and the triode Q4, then the signals are output to the pulse width modulation switching circuit by the photoelectric coupler U4. The pulse width modulation switching circuit successively outputs different frequency signals to the MCU.

The above description is only alternative embodiment of the present application and is not intended to limit the protection scope of the present application. Therefore, any equivalent variations made according to the structures, shapes and principles of the present application, should fall within the protection scope of the present application.

What is claimed is:

1. A method for adaptively adjusting frequency of a switching power supply, comprising:
    obtaining a signal-to-noise ratio (SNR) threshold, obtaining an SNR value of an AM/FM radio demodulator in real time, and comparing the SNR value with the SNR threshold;
    when the SNR value of the AM/FM radio demodulator is smaller than the SNR threshold, outputting a plurality of control signals to the switching power supply, and obtaining a plurality of operation frequencies of the switching power supply at which the switching power supply is controlled by each of the plurality of control signals;
    obtaining a plurality of SNR values of the AM/FM radio demodulator at each of the plurality of operation frequencies, and obtaining a maximum SNR value among the plurality of SNR values;
    outputting a control signal corresponding to the maximum SNR value, and controlling an operation frequency of the switching power supply with the control signal; and
    periodically obtaining an updated SNR value of the AM/FM radio demodulator at a preset time period, and comparing the updated SNR value to the SNR threshold.

2. The method for adaptively adjusting frequency of a switching power supply according to claim 1, wherein obtaining a plurality of operation frequencies of the switching power supply at which the switching power supply is controlled by each of the plurality of control signals comprises:
    separately obtaining a plurality of pulse width modulation (PWM) control signals at different duty cycles;
    separately converting the plurality of PWM control signals into a plurality of voltage signals;
    separately converting the plurality of voltage signals into a plurality of current signals; and
    converting the plurality of current signals into the plurality of operation frequencies at different duty cycles.

3. The method for adaptively adjusting frequency of a switching power supply according to claim 1, wherein obtaining a plurality of operation frequencies of the switching power supply at which the switching power supply is controlled by each of the plurality of control signals comprises:
    separately obtaining a plurality of voltage signals;
    separately converting the plurality of voltage signals into a plurality of current signals; and
    converting the plurality of current signals into the plurality of operation frequencies at different duty cycles.

4. The method for adaptively adjusting frequency of a switching power supply according to claim 1, wherein before obtaining a SNR threshold, obtaining an SNR value of an AM/FM radio demodulator in real time, and comparing the SNR value with the SNR threshold, the method further comprises:
    obtaining a start signal of an AM/FM audio source input mode, and determining whether to obtain the SNR value of the AM/FM radio demodulator and compare the SNR value to the SNR threshold based on the start signal of the AM/FM audio source input mode;
    obtaining a manual FM signal of an AM/FM mode, and determining whether to obtain the SNR value of the AM/FM radio demodulator and compare the SNR value to the SNR threshold based on the manual FM signal of the AM/FM mode; and obtaining a periodic adjustment signal, and when a preset period for the periodic adjustment signal is reached, obtaining the SNR value of the AM/FM radio demodulator, and comparing the SNR value to the SNR threshold.

5. An electronic device, comprising: a micro controller, an AM/FM radio demodulation module, an audio amplifier module, an audio output module and a power module, wherein,
the micro controller is coupled to the AM/FM radio demodulation module, the audio amplifier module and the power module, and is configured to generate a switching power supply adjustment signal and output a control signal to the AM/FM radio demodulation module, the audio amplifier module and the power module; the micro controller is configured to implement the method for adaptively adjusting frequency of a switching power supply according to claim 1;
the AM/FM radio demodulation module is coupled to the audio amplifier module, and is configured to receive an external radio signal, and after the external radio signal is converted into an audio signal, transmit the audio signal to the audio amplifier module;
the audio amplifier module is coupled to the audio output module, and is configured to receive and amplify the audio signal output by the AM/FM radio demodulation module, and output the amplified audio signal to the audio output module;
the audio output module is configured to receive the amplified audio signal from the audio amplifier module, and output the amplified audio signal;
the power module is configured to supply power to the micro controller, the AM/FM radio demodulation module, the audio amplifier module and the audio output module.

6. The electronic device according to claim 5, wherein the power module comprises a rectification filter unit coupled to an external power, a voltage regulating unit and a stabilized voltage power supply unit, and
wherein the rectification filter unit is coupled to the voltage regulating unit, and is configured to rectificate the external power to direct current (DC) high voltage and transmit the DC high voltage to the voltage regulating unit;
the voltage regulating unit is coupled to the stabilized voltage power supply unit, and is configured to convert the DC high voltage into a high frequency low voltage and transmit the high frequency low voltage to the stabilized voltage power supply unit,
the stabilized voltage power supply unit is configured to supply power to the micro controller, the AM/FM radio demodulation module, the audio amplifier module and the audio output module.

7. The electronic device according to claim 6, wherein an electric signal conversion unit is coupled between the micro controller and the voltage regulating unit, and the electric signal conversion unit is configured to convert the control signal output by the micro controller into a current signal, and the voltage regulating unit is further configured to convert the current signal into an operation frequency control signal for changing an operation frequency of the power module.

8. The electronic device according to claim 7, wherein the electric signal conversion unit comprises a voltage conversion sub-unit, a current conversion sub-unit and an isolation sub-unit, and
wherein the voltage conversion sub-unit is coupled to the micro controller, and is configured to convert a pulse width modulation (PWM) signal output by the micro controller into a voltage signal;
the current conversion sub-unit is coupled to the isolation sub-unit, and is configured to convert the voltage signal into a current signal;
the isolation sub-unit is coupled to the voltage regulating unit, and is configured to transmit an isolation current signal to the voltage regulating unit.

9. The electronic device according to claim 7, wherein the electric signal conversion unit comprises a current conversion sub-unit and an isolation sub-unit, and
wherein the current conversion sub-unit is coupled to the micro controller and the isolation sub-unit, and is configured to convert a voltage signal into a current signal and transmit the current signal to the isolation sub-unit;
the isolation sub-unit is coupled to the voltage regulating unit, and is configured to transmit an isolation current signal to the voltage regulating unit.

10. A system for adaptively adjusting frequency of a switching power supply, comprising:
a signal-to-noise ratio (SNR) value obtaining unit, configured to obtain an SNR value of an AM/FM radio demodulator in real time;
a control signal output unit, configured to output different control signals;
a comparing unit, configured to compare a preset SNR threshold to the SNR value obtained in real time, and when the SNR value is smaller than the preset SNR threshold, output a plurality of control signals to the switching power supply;
a frequency obtaining unit, configured to obtain a plurality of operation frequencies of the switching power supply at which the switching power supply is controlled by each of the plurality of control signals;
wherein the comparing unit is further configured to compare a plurality of SNR values corresponding to the plurality of operation frequencies, to obtain a maximum SNR value; and
wherein the system further comprises:
a switching power supply unit, configured to output a control signal corresponding to the maximum SNR value, and control an operation frequency of the switching power supply with the control signal; and
a timing unit, configured to obtain an adjustment period, and
wherein the SNR value obtaining unit is further configured to obtain an updated SNR value of the AM/FM radio demodulator based on the adjustment period.

* * * * *